(12) United States Patent
Haukka et al.

(10) Patent No.: US 7,691,757 B2
(45) Date of Patent: Apr. 6, 2010

(54) DEPOSITION OF COMPLEX NITRIDE FILMS

(75) Inventors: Suvi P. Haukka, Helsinki (FI); Tanja Claasen, Amsterdam (NL); Peter Zagwijn, Nijkerk (NL)

(73) Assignee: ASM International N.V. (NL)

(*) Notice: Subject to any disclaimer, the term of this patent is extended or adjusted under 35 U.S.C. 154(b) by 157 days.

(21) Appl. No.: 11/766,718

(22) Filed: Jun. 21, 2007

(65) Prior Publication Data

US 2008/0003838 A1    Jan. 3, 2008

Related U.S. Application Data

(60) Provisional application No. 60/816,104, filed on Jun. 22, 2006.

(51) Int. Cl.
H01L 21/31    (2006.01)
C23C 16/34    (2006.01)
(52) U.S. Cl. ............. 438/785; 427/255.28; 427/255.39; 427/255.394
(58) Field of Classification Search ............ 427/255.28, 427/255.39, 255.393–255.394; 438/785
See application file for complete search history.

(56) References Cited

U.S. PATENT DOCUMENTS

| | | | |
|---|---|---|---|
| 2,865,791 A | 12/1958 | Ruppet et al. | |
| 4,188,444 A | 2/1980 | Landau | |
| 4,262,631 A | 4/1981 | Kubacki | |
| 4,277,320 A | 7/1981 | Beguwala et al. | |
| 4,279,947 A | 7/1981 | Goldman et al. | |
| 4,298,629 A | 11/1981 | Nozaki et al. | |
| 4,363,828 A | 12/1982 | Brodsky et al. | |
| 4,389,973 A | 6/1983 | Suntola et al. | |
| 4,402,997 A | 9/1983 | Hogan et al. | |
| 4,413,022 A | 11/1983 | Suntola et al. | |
| 4,428,975 A | 1/1984 | Dahm et al. | |
| 4,495,218 A | 1/1985 | Azuma et al. | |
| 4,535,000 A | 8/1985 | Gordon | |
| 4,570,328 A | 2/1986 | Price et al. | |

(Continued)

FOREIGN PATENT DOCUMENTS

DE    101 32 882 A1    12/2002

(Continued)

OTHER PUBLICATIONS

European Search Report for counterpart EP application No. 05011705.

(Continued)

*Primary Examiner*—M. Wilczewski
*Assistant Examiner*—Toniae M Thomas
(74) *Attorney, Agent, or Firm*—Knobbe, Martens Olson & Bear LLP (57) ABSTRACT

Methods are provided for pulsed chemical vapor deposition (CVD) of complex nitrides, such as ternary metal nitrides. Pulses of metal halide precursors are separated from one another and nitrogen-containing precursor is provided during the metal halide precursor pulses as well as between the metal halide precursor pulses. Two different metal halide precursors can be provided in simultaneous pulses, alternatingly, or in a variety of sequences. The nitrogen-containing precursor, such as ammonia, can be provided in pulses simultaneously with the metal halide precursors and between the metal halide precursors, or continuously throughout the deposition. Temperatures can be kept between about 300° C. and about 700° C.

16 Claims, 4 Drawing Sheets

U.S. PATENT DOCUMENTS

| | | | |
|---|---|---|---|
| 4,585,671 A | 4/1986 | Kitagawa et al. |
| 4,684,542 A | 8/1987 | Jasinski et al. |
| 4,699,805 A | 10/1987 | Seelbach et al. |
| 4,715,937 A | 12/1987 | Moslehi et al. |
| 4,720,395 A | 1/1988 | Foster |
| 4,803,127 A | 2/1989 | Hakim |
| 4,828,224 A | 5/1989 | Crabb et al. |
| 4,834,020 A | 5/1989 | Bartholomew |
| 4,851,095 A | 7/1989 | Scobey et al. |
| 4,855,254 A | 8/1989 | Eshita et al. |
| 4,935,661 A | 6/1990 | Heinecke et al. |
| 5,015,330 A | 5/1991 | Okumura et al. |
| 5,111,266 A | 5/1992 | Furumura et al. |
| 5,214,002 A | 5/1993 | Hayashi et al. |
| 5,221,556 A | 6/1993 | Hawkins et al. |
| 5,227,329 A | 7/1993 | Kobayashi et al. |
| 5,246,881 A | 9/1993 | Sandhu et al. |
| 5,279,857 A | 1/1994 | Eichman et al. |
| 5,287,205 A | 2/1994 | Yamazaki et al. |
| 5,308,655 A | 5/1994 | Eichman et al. |
| 5,356,673 A | 10/1994 | Schmitt et al. |
| 5,356,821 A | 10/1994 | Naruse et al. |
| 5,389,398 A | 2/1995 | Suzuki et al. |
| 5,389,570 A | 2/1995 | Shiozawa |
| 5,453,858 A | 9/1995 | Yamazaki |
| 5,471,330 A | 11/1995 | Sarma |
| 5,591,494 A | 1/1997 | Sato et al. |
| 5,607,724 A | 3/1997 | Beinglass et al. |
| 5,614,257 A | 3/1997 | Beinglass et al. |
| 5,648,293 A | 7/1997 | Hayama et al. |
| 5,656,531 A | 8/1997 | Thakur et al. |
| 5,672,385 A | 9/1997 | Jimba et al. |
| 5,695,819 A | 12/1997 | Beinglass et al. |
| 5,698,771 A | 12/1997 | Shields et al. |
| 5,700,520 A | 12/1997 | Beinglass et al. |
| 5,741,330 A | 4/1998 | Brauker et al. |
| 5,769,950 A | 6/1998 | Takasu et al. |
| 5,786,027 A | 7/1998 | Rolfson |
| 5,789,030 A | 8/1998 | Rolfson |
| 5,837,580 A | 11/1998 | Thakur et al. |
| 5,849,601 A | 12/1998 | Yamazaki |
| 5,874,129 A | 2/1999 | Beinglass et al. |
| 5,876,797 A | 3/1999 | Beinglass et al. |
| 5,885,869 A | 3/1999 | Turner et al. |
| 5,907,792 A | 5/1999 | Droopad et al. |
| 5,916,365 A | 6/1999 | Sherman |
| 5,925,188 A | 7/1999 | Oh |
| 5,959,326 A | 9/1999 | Aiso et al. |
| 6,015,590 A | 1/2000 | Suntola et al. |
| 6,027,705 A | 2/2000 | Kitsuno et al. |
| 6,056,823 A | 5/2000 | Sajoto et al. |
| 6,083,810 A | 7/2000 | Obeng et al. |
| 6,087,229 A | 7/2000 | Aronowitz et al. |
| 6,103,600 A | 8/2000 | Ueda et al. |
| 6,136,654 A | 10/2000 | Kraft et al. |
| 6,159,828 A | 12/2000 | Ping et al. |
| 6,161,498 A | 12/2000 | Toraguchi et al. |
| 6,171,662 B1 | 1/2001 | Nakao |
| 6,197,669 B1 | 3/2001 | Twu et al. |
| 6,197,694 B1 | 3/2001 | Beinglass |
| 6,200,893 B1 | 3/2001 | Sneh |
| 6,203,613 B1 | 3/2001 | Gates et al. |
| 6,228,181 B1 | 5/2001 | Yamamoto et al. |
| 6,252,295 B1 | 6/2001 | Cote et al. |
| 6,271,054 B1 | 8/2001 | Ballantine et al. |
| 6,294,399 B1 | 9/2001 | Fukumi et al. |
| 6,326,311 B1 | 12/2001 | Ueda et al. |
| 6,373,112 B1 | 4/2002 | Murthy et al. |
| 6,385,020 B1 | 5/2002 | Shin et al. |
| 6,390,753 B1 | 5/2002 | De Ridder |
| 6,391,803 B1 | 5/2002 | Kim et al. |
| 6,455,892 B1 | 9/2002 | Okuno et al. |
| 6,468,924 B2 | 10/2002 | Lee et al. |
| 6,503,846 B1 | 1/2003 | Niimi et al. |
| 6,524,650 B1 | 2/2003 | Shimahara et al. |
| 6,528,530 B2 | 3/2003 | Zeitlin et al. |
| 6,537,910 B1 | 3/2003 | Burke et al. |
| 6,551,893 B1 | 4/2003 | Zheng et al. |
| 6,573,184 B2 | 6/2003 | Park |
| 6,585,823 B1 | 7/2003 | Van Wijck |
| 6,613,695 B2 | 9/2003 | Pomarede et al. |
| 6,638,879 B2 | 10/2003 | Hsieh et al. |
| 6,656,282 B2 | 12/2003 | Kim et al. |
| 6,663,332 B1 | 12/2003 | Sluijk et al. |
| 6,746,240 B2 | 6/2004 | De Ridder et al. |
| 6,814,572 B2 | 11/2004 | Okabe |
| 6,821,825 B2 | 11/2004 | Todd et al. |
| 6,824,816 B2 | 11/2004 | Aaltonen et al. |
| 6,825,134 B2 | 11/2004 | Law et al. |
| 6,924,223 B2 | 8/2005 | Yamasaki et al. |
| 6,962,859 B2 | 11/2005 | Todd et al. |
| 6,991,684 B2 | 1/2006 | Kannan et al. |
| 7,005,392 B2 | 2/2006 | Baum et al. |
| 7,125,582 B2 | 10/2006 | McSwiney et al. |
| 7,172,792 B2 | 2/2007 | Wang et al. |
| 7,192,626 B2 | 3/2007 | Dussarrat et al. |
| 2001/0025605 A1 | 10/2001 | Nagakura |
| 2002/0047151 A1 | 4/2002 | Kim et al. |
| 2002/0073925 A1 | 6/2002 | Noble et al. |
| 2002/0098627 A1 | 7/2002 | Pomarede et al. |
| 2002/0121242 A1 | 9/2002 | Minami et al. |
| 2002/0124800 A1 | 9/2002 | Moriyama |
| 2002/0160605 A1 | 10/2002 | Kanzawa et al. |
| 2002/0168868 A1 | 11/2002 | Todd |
| 2002/0197831 A1 | 12/2002 | Todd et al. |
| 2003/0022528 A1 | 1/2003 | Todd |
| 2003/0059535 A1 | 3/2003 | Luo et al. |
| 2003/0082300 A1 | 5/2003 | Todd et al. |
| 2003/0111013 A1 | 6/2003 | Oosterlaken et al. |
| 2003/0134038 A1 | 7/2003 | Paranjpe |
| 2003/0143841 A1 | 7/2003 | Yang et al. |
| 2003/0148605 A1 | 8/2003 | Shimogaki et al. |
| 2003/0176047 A1 | 9/2003 | Doan et al. |
| 2004/0009336 A1 | 1/2004 | Marcadal et al. |
| 2004/0025786 A1 | 2/2004 | Kontani et al. |
| 2004/0096582 A1 | 5/2004 | Wang et al. |
| 2004/0129212 A1 | 7/2004 | Gadgil et al. |
| 2004/0221807 A1 | 11/2004 | Verghese et al. |
| 2004/0224504 A1 | 11/2004 | Gadgil |
| 2004/0235314 A1 | 11/2004 | Takimoto |
| 2004/0250765 A1 | 12/2004 | Ishizaka et al. |
| 2005/0039680 A1 | 2/2005 | Beaman et al. |
| 2005/0042373 A1 | 2/2005 | Kraus et al. |
| 2005/0045102 A1 | 3/2005 | Zheng et al. |
| 2005/0064684 A1 | 3/2005 | Todd et al. |
| 2005/0079692 A1 | 4/2005 | Samoilov et al. |
| 2005/0080286 A1 | 4/2005 | Wang et al. |
| 2005/0118837 A1 | 6/2005 | Todd et al. |
| 2005/0250302 A1 | 11/2005 | Todd et al. |
| 2005/0287806 A1 | 12/2005 | Matsuura |
| 2006/0060137 A1 | 3/2006 | Hasper et al. |
| 2006/0068104 A1 | 3/2006 | Ishizaka et al. |
| 2006/0084283 A1 | 4/2006 | Paranjpe et al. |
| 2006/0088985 A1 | 4/2006 | Haverkort et al. |
| 2006/0189168 A1 | 8/2006 | Sato et al. |
| 2007/0077775 A1 | 4/2007 | Hasper et al. |
| 2007/0084404 A1 | 4/2007 | Verghese et al. |
| 2008/0317972 A1* | 12/2008 | Hendriks et al. ............ 427/569 |

FOREIGN PATENT DOCUMENTS

| | | |
|---|---|---|
| EP | 0 368 651 A2 | 5/1990 |
| EP | 0 442 490 A1 | 8/1991 |
| EP | 0 486 047 A2 | 5/1992 |

| | | |
|---|---|---|
| EP | 0 526 779 A1 | 2/1993 |
| EP | 0 747 974 A2 | 12/1996 |
| EP | 1 065 728 A2 | 1/2001 |
| GB | 2 332 564 A | 6/1999 |
| JP | 59078919 A | 1/1982 |
| JP | 57209810 A | 12/1982 |
| JP | 59078918 A | 5/1984 |
| JP | 60043485 A | 3/1985 |
| JP | 60-245233 | 12/1985 |
| JP | 61-095535 | 5/1986 |
| JP | 61153277 A | 7/1986 |
| JP | 62076612 A | 4/1987 |
| JP | 63003414 A | 1/1988 |
| JP | 63003463 A | 1/1988 |
| JP | 64-081311 | 3/1989 |
| JP | 01-179710 | 7/1989 |
| JP | 01217956 A | 8/1989 |
| JP | 01268064 A | 10/1989 |
| JP | 02155225 A | 6/1990 |
| JP | 03091239 A | 4/1991 |
| JP | 03185817 A | 8/1991 |
| JP | 03187215 A | 8/1991 |
| JP | 03292741 A | 12/1991 |
| JP | 04323834 A | 11/1992 |
| JP | 05021378 A | 1/1993 |
| JP | 05062911 A | 3/1993 |
| JP | 07249618 A | 9/1995 |
| JP | 08242006 A | 9/1996 |
| JP | 11317530 | 11/1999 |
| JP | 2000-100811 | 4/2000 |
| JP | 2004-096060 | 3/2004 |
| WO | WO 02/43115 A2 | 5/2002 |
| WO | WO 02/064853 A2 | 8/2002 |
| WO | WO 03/008663 A1 | 1/2003 |
| WO | WO 2004/008491 A2 | 1/2004 |
| WO | WO 2004/008491 A3 | 1/2004 |
| WO | WO 2004/009861 A2 | 1/2004 |

OTHER PUBLICATIONS

Hillman et al., "Properties of LPCVD TiN Barrier Layers," Microelectronic Engineering 19 (1992) 375-378.

Hiltunen et al., "Nitrides of Titanium, Niobium, Tantalum and Molybdenum Grown as Thin Films by the Atomic Layer Epitaxy Method," Thin Solid Films, 166 (1988) 149-154.

Hiramatsu et al., "Formation of TiN films with Low Cl Concentration by Pulsed Plasma Chemical Vapor Deposition", *J. Vac. Sci. Technol. A*, vol. 14, No. 3, May/Jun. 1996; pp. 1037-1040.

Ikoma et al., Growth of Si/3C-SiC/Si(100) hetrostructures by pulsed supersonic free jets, Applied Physics Letters, vol. 75, No. 25, pp. 3977-3979, Dec. 1999.

International Serach Report dated Nov. 13, 2003 for international patent appoilcation No. PCT/US02/02921, filed on Feb. 1, 2002.

Ishihara et al., "Low-temperature chemical-vapor-deposition of silicon-nitride from tetra-silane and hydrogen azide," *Materials Research Society Symposium Proceedings*, vol. 284, p. 3-8 (1993).

Iyer, R. Suryanarayanan et al., "A Process Method of Silicon Nitride Atomic Layer Cyclic Deposition," Semicon Taiwan 2001, pp. 17-25.

Kanoh et al., "Low-temperature chemical-vapor-deposition of silicon nitride," *Journal de Physique IV*, vol. 2, p. C2-831-C2-837 (1991).

Nakano et al., "Digital Chemical Vapor Deposition of $SiO_2$," Appl Phys. Lett. 57 (11) Sep. 1990, pp. 1096-1098.

Olivares, J. et al., "Solid-phase crystallization of amorphous SiGe films deposed by LPCVD on SiOs and glass," *Thin Solid Films* 337 (1999), pp. 51-54.

Pintchovski et al., "LPCVD titanium nitride-deposition, properties, and application to ULSI", *Tungsten and Other Refractory Metal for USLI Application*, No. IV, pp. 275-282, (1989).

Ramanuja, et al., "Synthesis and characterization of low pressure chemically vapor deposited titanium nitride films using $TiCl_4$ and $NH_3$," Materials Letters 57 (2002) 261-269.

Sakaue et al., Digital Chemical Vapor Deposition of $SiO_2$ Using a Repetitive Reaction of Triethylsilane/Hydrogen and Oxidation, Japanese Journal of Applied Materials, vol. 30, No. 1B, Jan. 1990, pp. L 124-L 127.

Sze, VLSI Technology, "Arrhenius plot for polysilicon deposition for different silane partial pressures," (1988) pp. 240-241.

Travis et al., "A scalable submicron contact technology using conformal LPCVD TiN", *iIDEM Conference Proceedings*, Dec. 1990.

Yeh et al., "Low-temperature chemical-vapor-deposition of silicon-nitride film from hexachloro-disilane and hydrazine," *Jpn. J. Appl. Phys.* vol. 35, Part 1, No. 2B, p. 1509-1512 (Feb. 1996).

* cited by examiner

DEPOSITION OF COMPLEX NITRIDE FILMS

REFERENCE TO RELATED APPLICATIONS

This application claims the priority benefit under 35 U.S.C. §119(e) of Provisional Patent Application No. 60/816,104, filed Jun. 22, 2006.

In addition, this application is related to U.S. patent application Ser. No. 11/294,843, filed Dec. 5, 2005, which is incorporated herein by reference.

FIELD OF THE INVENTION

The invention relates to the deposition of thin films such as films used in the manufacture of semiconductor devices.

BACKGROUND OF THE INVENTION

Nitride films find widespread application in semiconductor manufacturing, primarily because nitride films are dense and have excellent properties as diffusion barriers and as etch stop layers. Typically, nitride films are deposited by Chemical Vapor Deposition (CVD). Deposition of TiN using $TiCl_4$ and $NH_3$ is described by Price et al in U.S. Pat. No. 4,570,328. Temperatures in excess of 680° C. prevent the incorporation of unacceptably large quantities of chlorine into the film. Many metal-organic source materials have been developed to prevent the incorporation of large quantities of chlorine while simultaneously allowing lower deposition temperatures to be used. Examples are tetrakis(dimethylamido) titanium (TDMAT) and tetrakis(diethylamido) titanium (TDEAT). More recently, Atomic Layer Deposition (ALD) appeared to be a useful technique for the deposition of thin metal nitride films with good control of deposition rate and uniformity. The use of $TiCl_4$, $NbCl_5$, $TaCl_5$ and $MoCl_5$ in combination with $NH_3$ is proposed by Hiltunen et al., Thin Solid Films, 166 (1988) 149-154, for the deposition of TiN, NbN, TaN, and MoN respectively. Undesirably, ALD results in low deposition rates and therefore lower throughput.

Accordingly, there is a continuing need for methods for forming nitride films.

SUMMARY

According to some embodiments of the invention, a method is provided for the deposition of a nitride-containing film onto a substrate. The method comprises providing a substrate in a reaction chamber and heating the substrate in the reaction chamber to a temperature between about 300° C. and about 700° C. A first metal halide precursor is flowed into the reaction chamber in temporally separated pulses and a second metal halide precursor is also flowed into the reaction chamber in temporally separated pulses. A nitrogen-containing precursor is also flowed into the reaction chamber. The nitrogen-containing precursor can be introduced into the reaction chamber in various sequences including: (i) flowing the nitrogen-containing precursor during the metal halide precursor pulses to induce a thermally activated reaction between at least one of the metal halide precursors and the nitrogen containing precursor and (ii) flowing the nitrogen-containing precursor between the metal halide precursor pulses.

DETAILED DESCRIPTION OF SOME EMBODIMENTS

In a search of optimizing the properties of nitride films, nitrides of different metals can be selected for particular applications, such as nitrides continuing Ti, Ta, Hf, Nb, and Mo. Further optimization of film properties can be achieved by using mixtures of two or more nitrides, which has been found particularly beneficial. One difficulty in developing a deposition process for such mixed nitrides is finding precursor materials for the respective metals or semiconductors that are compatible with each other. In many cases, the various precursor materials, although individually suited to deposit a single nitride, are optimally employed at different deposition temperatures. In particular, metal-organic precursor materials are not very thermally stable and often require deposition temperatures below 400° C. to prevent thermal decomposition of the precursor itself, whereas halide precursor materials such as $TiCl_4$ typically require process temperatures above 400° C. to get significant deposition rates of nitride films when used in combination with $NH_3$. Alternatively, deposition of mixed nitrides can employ a single wafer reactor to allow control of the deposition process such as described in U.S. Patent Appl. Publication 2004/0009336, published Jan. 14, 2004, wherein TiSiN films are grown using TDMAT, $SiH_4$ and $NH_3$.

Co-assigned with the present patent application is U.S. patent application Ser. No. 11/096,861, relating to pulsed CVD of TiN in a hot wall batch furnace, that application discloses using pulses of $TiCl_4$ and a continuous flow of $NH_3$. This resulted in excellent control of uniformity and film thickness and in a strong reduction of the chlorine content in the deposited film in comparison to films deposited by CVD. Pulsed CVD combines the advantages of CVD and ALD and is a particularly useful way of operating a vertical furnace for batch processing.

Pulsed CVD, flowing $NH_3$ between halide metal precursor pulses, results is a drastic reduction of the chlorine content in a deposited film compared to a film deposited by regular CVD (in which precursors are not introduced in a plurality of pulses) at the same temperature. An advantage of halide metal precursors is that they are thermally very stable: the halide source materials can be heated to temperatures of several hundred degrees Centigrade, or even to the deposition process temperature without risk of thermal decomposition. A second reactant, preferably a nitrogen-containing reactant such as $NH_3$, is used to facilitate the chemical reaction.

According to some embodiments of the invention, two or more metal halide precursors and $NH_3$ are flowed into a reaction chamber for the deposition of a mixed nitride film. The $NH_3$ is flowed into the chamber to induce a thermally activated reaction between the $NH_3$ and at least one metal halide precursor. Preferably, the $NH_3$ is flowed into the chamber to induce a thermally activated reaction between the $NH_3$ and each of the two metal halide precursors. Instead of $NH_3$, other nitrogen precursors, such as hydrazine ($N_2H_4$), can also be used. For the purpose of this disclosure "metal" will be deemed to include Si, Ge and Boron. The different metal halide precursors are generally very compatible and the temperatures required for a reaction with $NH_3$ are in a similar range: significant reaction rates can be achieved in the temperature range of from about 300° C. to about 700° C., preferably from about 400° C. to about 700° C., more preferably in the range of about 450° C. to about 550° C. The process can further be controlled by flowing the two or more metal halide precursors into the reaction chamber in temporally separated pulses.

Figure 1:
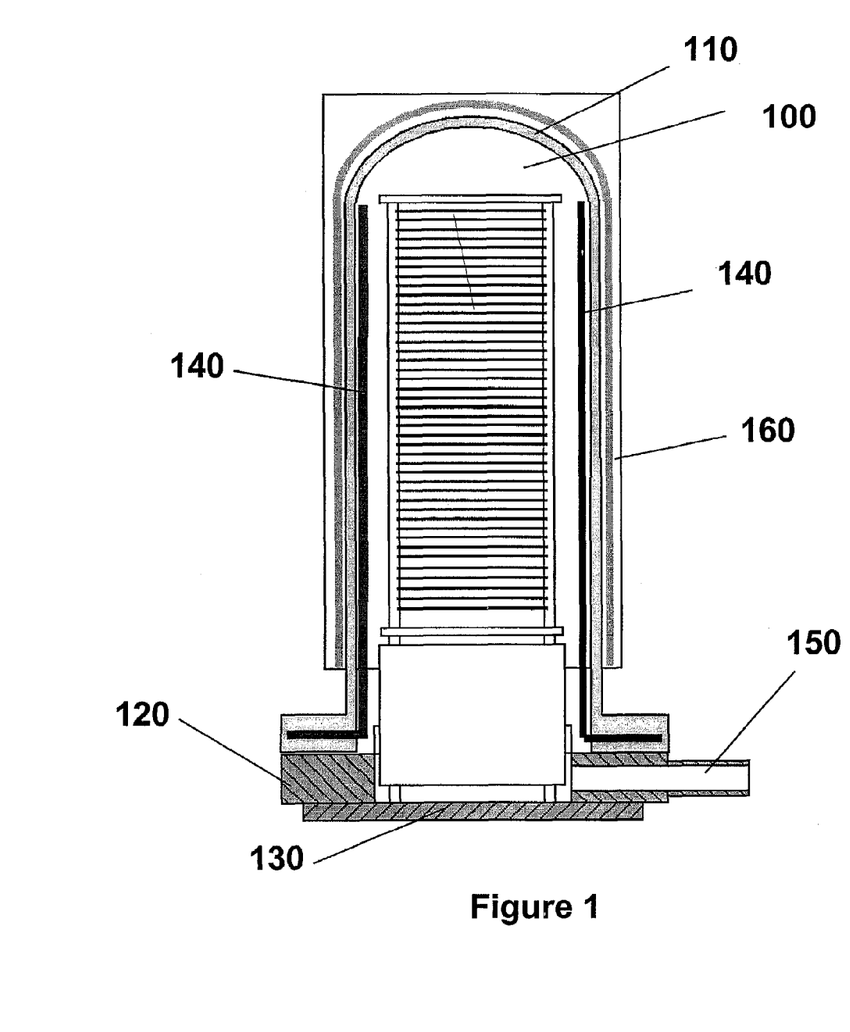
FIG. 1 illustrates an exemplary furnace for use with preferred embodiments of the invention.

An exemplary furnace for use with preferred embodiments of the invention is shown in FIG. 1 and commercially available under the trademark A412™ from ASM Europe, The Netherlands. In this vertical furnace design, a reaction chamber 100 is delimited by a process tube 110, a support flange 120 and a door 130. The process tube 110 is closed at the top. An advantage of this design in comparison to a design that has a top inlet for gases is that the process tube 110 is simpler in construction and the problems of gas-tightness and thermal isolation associated with use of a top inlet can be avoided. All gases in this set-up are introduced through gas injectors 140, of which two are shown. Preferably, separate injectors 140 are used for each gas. In the case of TiN deposition with $TiCl_4$ and $NH_3$, one injector 140 is used for each of the process gases. In the case of the deposition of mixed nitrides, two or more metal halide precursors can be injected through the same injector or through separate injectors. These injectors 140 are preferably multiple hole gas injectors having holes distributed over the height of the tube 110. An additional injector 140 can be used for a purge gas, preferably an inert gas such as nitrogen gas or a noble gas such as Ar or He. The injector 140 for the purge gas is preferably a tube with an open end at its top and without gas discharge holes in its sidewall, so that all the purge gas is discharged near the top of the reaction chamber 100. The gases are exhausted through an exhaust 150 near the bottom of the reaction chamber 100. The process tube is surrounded by a heater 160 configured to heat the process chamber to a temperature between 300° C. and 700° C.

Figure 2:
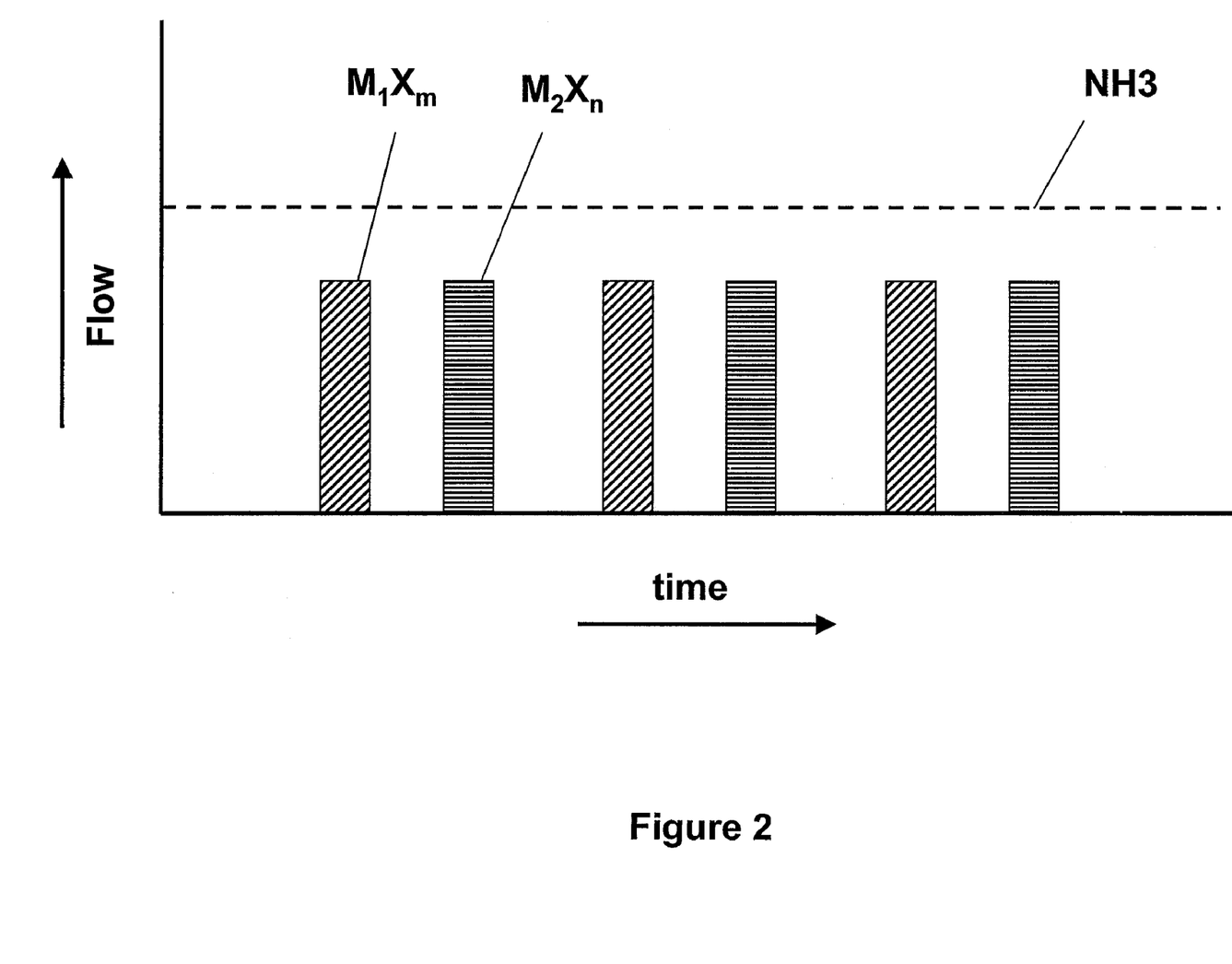
FIG. 2 is a graph illustrating temporally separated metal halide pulses and continuous ammonia flow in accordance with embodiments of the invention.

To deposit a nitrogen-containing film, a pulsed CVD process with a gas flow sequence such as schematically depicted in FIG. 2 can be used. Temporally separated pulses of two different precursors are fed into the reaction chamber, wherein the first constituent component $M_1$ of the nitride film is selected from the group of Ti, Zr, Hf, V, Nb, Ta, Cr, Mo, W, and Al and the second constituent component $M_2$ of the nitride film is selected from the group of Si, Ge, B, Ti, Zr, Hf, V, Nb, Ta, Cr, Mo, W, and Al. In FIG. 2, X stands for a halide atom. The halide ligand atoms can be F, Cl, I or Br or any combination thereof. Preferably, the halide is Cl. The precursor pulses are shown with equal magnitude e.g. equal flow rates. In some embodiments, they may have a different magnitude. The subscripts m and n are integer numbers equal to the valence of $M_1$ and $M_2$, typically between 3 and 6. A person skilled in the art will recognize that the presented formulas for the precursors are presented as monomeric formulas and the gas phase composition and oxidation state of these precursors can be different, for example, depending upon the temperature. Dimeric, trimeric and more clusterized forms of these precursors might be present in the gas phase and, in some cases, the metal in a precursor can have lower oxidation states.

With continued reference to FIG. 2, a regular alternating sequence of pulses is shown for $M_1X_m$ and $M_2X_n$. In some embodiments, the sequence may be varied depending on the desired composition of the film, for example by flowing a first number of sequential pulses of the first metal halide $M_1X_m$ to the reaction chamber and then flowing a second number of sequential pulses of the second metal halide precursor $M_2X_n$ to the reaction chamber. In the illustrated embodiment, the $NH_3$ flow is continuous and at a constant level during the process. The flow rate of the $NH_3$ may also vary during the deposition process. The level of the $NH_3$ flow can, e.g., be reduced during the metal halide pulses or can even be non-continuous with interruptions in between the metal halide pulses as shown in FIGS. 3 and 4.

Figure 3:
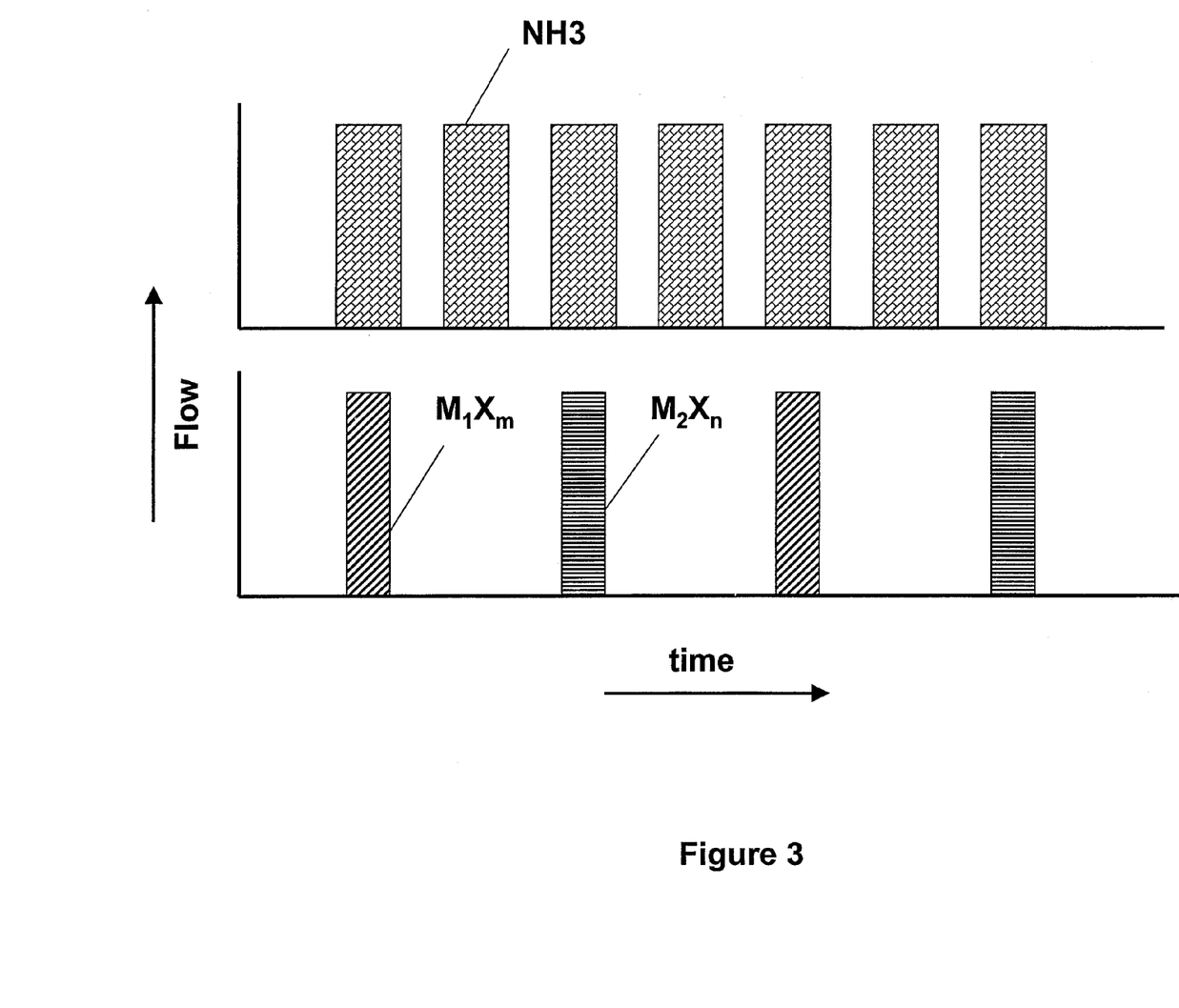
FIG. 3 is a graph illustrating temporally separated metal halide pulses and separate ammonia pulses in accordance with other embodiments of the invention.

In FIG. 3, the $NH_3$ is introduced in temporally separated pulses, as are the metal halides. Preferably, the $NH_3$ pulses that are provided simultaneously with the metal halide pulses start before the start of the metal halide pulse and end after ending of the metal halide pulse to ensure nitrogen precursor presence during deposition. After ending of the metal halide pulse and the overlapping $NH_3$ pulse, the reaction chamber is evacuated. Preferably, an intermediate $NH_3$ pulse is provided to achieve adequate halide removal and nitrogen incorporation in the deposited film. In the example of FIG. 3, the two different metal halide pulses are introduced in an alternating manner.

Figure 4:
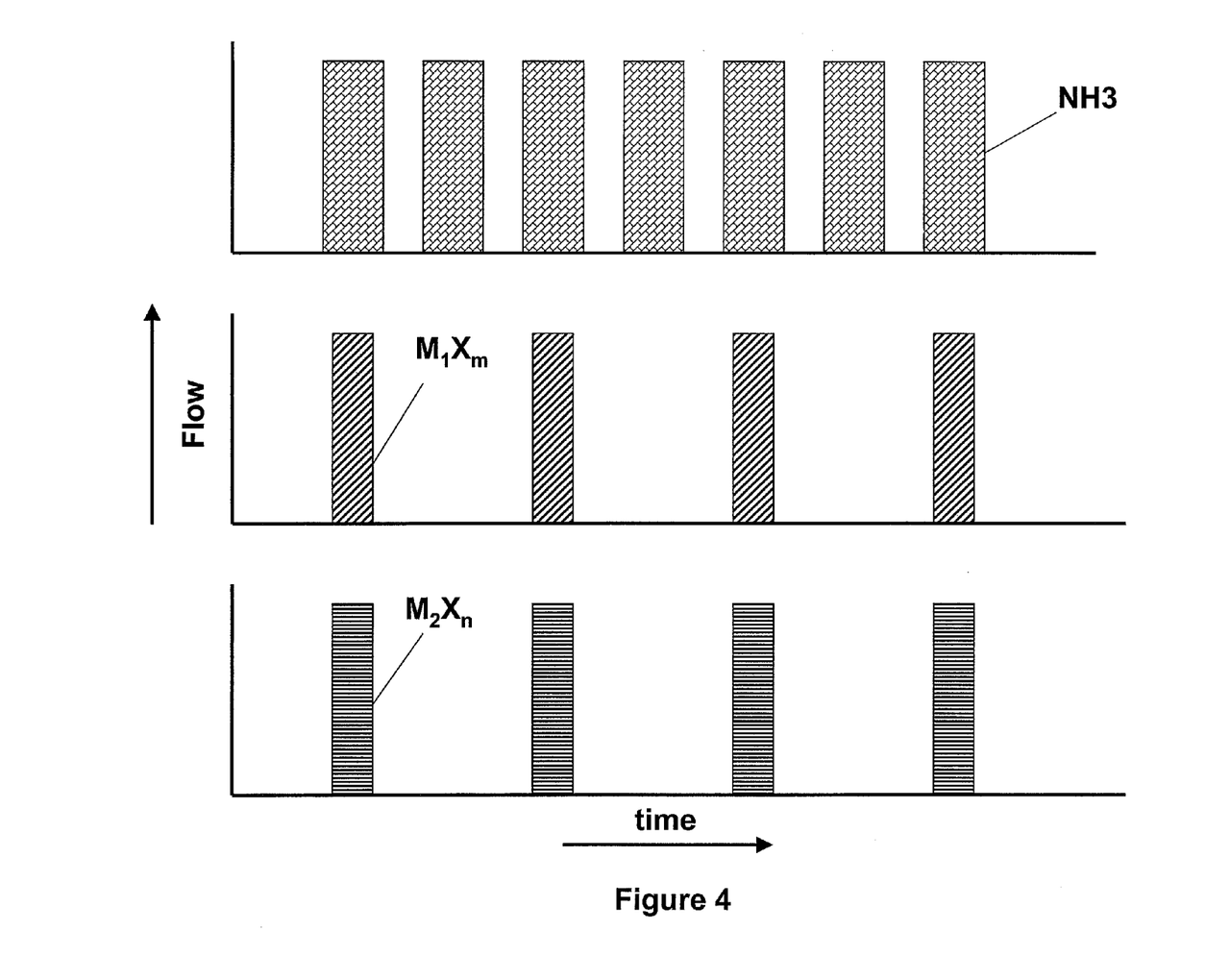
FIG. 4 is a graph illustrating simultaneous or mixed metal halide pulses and separate ammonia pulses, in accordance with other embodiments of the invention.

In FIG. 4, the two metal halide pulses overlap temporally. $NH_3$ pulses are flowed simultaneously with the metal halide pulses and additional intermediate $NH_3$ pulses are provided between the metal halide pulses, wherein gases are removed, e.g. by evacuation from the reaction chamber between the $NH_3$ pulses. The evacuation of the reaction chamber can be combined with flowing a purge gas through the reaction chamber. A purge gas such as $N_2$ or a noble gas can flow during part of the deposition pulses or throughout the process. In FIG. 4, the different metal halide pulses can over-lap temporally with each other, but the preceding of succeeding pulses remain temporally separated with intervening provision of $NH_3$, either in pulses (as shown) or by continuous $NH_3$ flow (like FIG. 2).

In pulsed CVD, the metal halide precursor and $NH_3$ are simultaneously present within the deposition chamber that houses the substrates, at least during part of the metal halide pulses. Flowing the $NH_3$ during the metal halide pulses and maintaining a deposition temperature between about 300° C. and about 700° C. induces a thermally activated reaction between the metal halide and the $NH_3$, resulting in much higher deposition thicknesses than is possible for the alternating pulses used in ALD. In ALD, due to steric hindrance of the ligands and limited availability of reactive sites, among other things, the deposited thickness per deposition cycle is typically only a small fraction of a monolayer. In pulsed CVD, the preferred deposited thickness per deposition cycle is in the range of one full monolayer to a few monolayers.

In a preferred embodiment of the invention, the metal and semiconductor precursor materials used for the deposition of mixed nitrides are halides. The metal is preferably selected from the group of Ti, Zr, Hf, V, Nb, Ta, Cr, Mo, W, and Al and a semiconductor selected from the group of Si and Ge, with B as a dopant. The halide can be a fluoride, chloride, iodide or bromide or any combination thereof. Preferably, the halide is selected from the group of $SiCl_4$, $SiHCl_3$, $SiH_2Cl_2$, $SiH_3Cl$, $GeCl_4$, $GeHCl_3$, $GeH_2Cl_2$, $GeHCl_3$, $BCl_3$, $TiCl_4$, $ZrCl_4$, $HfCl_4$, $VCl_5$, $TaCl_5$, $CrCl_4$, $MoCl_5$, $MoF_6$, $MoF_5$, $WCl_5$, $WCl_6$, $WF_6AlCl_3$ and $AlHCl_2$.

Possible candidates for mixed nitrides are TiSiN, TaSiN, HfSiN, ZrSiN, TiAlN, TaAlN, HfAlN, ZrAlN, TiHfN, TiZrN and HfZrN, preferably TiSiN, TaSiN TiAlN and TiHfN. However, in principle, any combination of two or more of the above mentioned metals can be used.

EXAMPLE 1

In a first example, TiSiN is formed by pulsed CVD, using $TiCl_4$, $SiCl_4$ and $NH_3$ as source materials. The process conditions are: process temperature between 450° C. and 550° C., $TiCl_4$ and $SiCl_4$ are alternatingly pulsed, $TiCl_4$ pulse time 30 seconds, $SiCl_4$ pulse time 30 seconds, interval time between metal precursor pulses 2 minutes, $NH_3$ flow constant (per FIG. 2) at a level of 0.2 slm. The deposited thickness per complete cycle is about 1 mm.

EXAMPLE 2

In a second example, TiSiN is formed by pulsed CVD using $TiCl_4$, DCS and $NH_3$ as source materials. The process conditions are: process temperature between 450° C. and 550° C., $TiCl_4$ and DCS are alternatingly pulsed, $TiCl_4$ pulse time 30 seconds, DCS pulse time 30 seconds, interval time between metal precursor pulses 2 minutes, $NH_3$ flow constant (per FIG. 2) at a level of 0.2 slm. The deposited thickness per complete cycle is about 1 nm.

EXAMPLE 3

In a third example, TiAlN is formed by pulsed CVD using $TiCl_4$, $AlCl_3$ and $NH_3$ as source materials. Although TMA is by far the most commonly used aluminum source material for deposition of aluminum-containing films, $AlCl_3$ is an easily available alternative with relatively high vapor pressure of 1 Torr at 100° C. and a $AlCl_3$ container temperature between 100° C. and 130° C. is sufficient to be able to generate source material pulses that are adequate for a batch system. The process settings are: process temperature between 450° C. and 550° C., $TiCl_4$ and $AlCl_3$ are alternatingly pulsed, $TiCl_4$ pulse time 30 seconds, $AlCl_3$ pulse time 30 seconds, interval time between metal precursor pulses 2 minutes, $NH_3$ flow constant (per FIG. 2) at a level of 0.2 slm. When using direct liquid injection, a precursor dosing rate in the range between 1 and 10 g/minute is adequate, preferably the dosing rate is about 5 g/minute. The estimated deposited thickness per complete cycle is about 1 nm.

EXAMPLE 4

In a fourth example, TiSiN is formed by pulsed CVD using $TiCl_4$, DCS and $NH_3$ as source materials. The use of DCS in combination with $TiCl_4$ is particularly beneficial as, when introduced simultaneously (per FIG. 4), the DCS can reduce the Ti(IV) to Ti(III) which is the most difficult step of the chemical reactions involving $TiCl_4$. The process conditions are: process temperature between 450° C. and 550° C., $TiCl_4$ and DCS are simultaneously pulsed (per FIG. 4), pulse time 30 seconds, interval time between metal precursor pulses 3 minutes, $NH_3$ flow pulsed (per FIG. 3 or 4) at a level of 0.2 slm, $NH_3$ pulse times 1 minute for the pulses simultaneously with the metal halide pulses as well as for the $NH_3$ pulses in between the metal halide pulses and evacuation times of 30 seconds in between the $NH_3$ pulses. The deposited thickness per complete cycle is about 1 nm.

It will be appreciated that various modifications of the above-described embodiments are possible. For example, a chlorine removing agent can be flowed into the reaction chamber. Such an agent can be flowed into the reaction chamber in a continuous manner or in temporally separated pulses. Examples of suitable chlorine removing agents are carbon chains comprising a double carbon-carbon bond (alkenes), such as ethane ($C_2H_4$), propene ($C_3H_6$) and butane ($C_4H_8$), or triple carbon-carbon bonds, such as ethyne, ($C_2H_2$), propyne ($C_3H_4$), and buthyne ($C_4H_6$). Ring-structured carbon chains, like benzene, cyclohepthene, or cyclopentadienyl that have at least one double bond can also be used. The double bond can break open and each carbon dangling bond can connect to a chlorine atom.

Various modifications and alterations of the embodiments described herein will be apparent to those skilled in the art without departing from the scope and spirit of this invention. For example, features of different embodiments can be combined. Accordingly, it is to be understood that the invention is not limited to the embodiments disclosed herein, and that the claims should be interpreted as broadly as the prior art allows.

We claim:

1. A method for depositing a nitride-containing film onto a substrate, comprising:
   providing a substrate in a reaction chamber;
   heating the substrate in the reaction chamber;
   flowing a first metal halide precursor into the reaction chamber in temporally separated pulses;
   flowing a second metal halide precursor into the reaction chamber in temporally separated pulses; and
   flowing a nitrogen containing precursor into the reaction chamber, wherein flowing the nitrogen-containing precursor comprises:
      flowing the nitrogen-containing precursor during the pulses of the first and second metal halide precursors to induce a thermally activated reaction between at least one of the metal halide precursors and the nitrogen-containing precursor, and
      flowing the nitrogen containing precursor between the pulses of the first and the second metal halide precursors.

2. The method of claim 1, wherein flowing the nitrogen-containing precursor comprises flowing $NH_3$.

3. The method of claim 1, wherein flowing the nitrogen-containing precursor comprises continuously flowing the nitrogen-containing precursor.

4. The method of claim 3, wherein flowing the nitrogen-containing precursor comprises flowing the nitrogen-containing precursor in the reaction chamber at a constant rate.

5. The method of claim 1, wherein flowing the nitrogen-containing precursor comprises flowing the nitrogen-containing precursor in temporally separated pulses.

6. The method of claim 1, wherein the first metal halide precursor comprises a metal selected from the group consisting of Ti, Zr, Hf V, Nb, Ta, Cr, Mo, W, and Al.

7. The method of claim 6, wherein the second metal halide precursor comprises a metal selected from the group consisting of Si, Ge, B, Ti, Zr, Hf, V, Nb, Ta, Cr, Mo, W, and Al and is different from the first metal.

8. The method of claim 1, wherein the temporally separated pulses of the first metal halide precursor and the second metal halide precursor comprise at least a period of alternation of the first metal halide precursor pulses with the second metal halide precursor pulses.

9. The method of claim 1, wherein flowing the first and second metal halide precursors comprises simultaneously flowing pulses of the first metal halide precursor and pulses of the second metal halide precursor into the reaction chamber.

10. The method of claim 1, wherein providing the substrate comprises providing a plurality of substrates in the reaction chamber.

11. The method of claim 1, wherein the reaction chamber is provided in a vertical furnace.

12. The method of claim 1, wherein the first and second metal halide precursors comprise halogens selected from the group consisting of F, Cl, I, Br and combinations thereof.

13. The method of claim 1, wherein the deposited nitride is selected from the group consisting of TiSiN, TaSiN, TiAlN and TiHfN.

14. The method of claim 1, wherein the deposited nitride is selected from the group consisting of TiSiN, TaSiN, HfSiN, ZrSiN, TiAlN, TaAlN, HfAlN, ZrAlN, TiHfN, TiZrN and HfZrN.

15. The method of claim 1, wherein heating the substrate comprises heating the substrate to a temperature between about 300° C. and 700° C.

16. The method of claim 15, wherein heating the substrate comprises heating the substrate to a temperature between about 450° C. and 550° C.

* * * * *

UNITED STATES PATENT AND TRADEMARK OFFICE
CERTIFICATE OF CORRECTION

PATENT NO. : 7,691,757 B2
APPLICATION NO. : 11/766718
DATED : April 6, 2010
INVENTOR(S) : Haukka et al.

It is certified that error appears in the above-identified patent and that said Letters Patent is hereby corrected as shown below:

On the Title Page

On Page 3, Item (56), line 7, under "Other Publications," please change "hetrostructures" to --heterostructures--.

On Page 3, Item (56), line 10, under "Other Publications," please change "Serach" to --Search--.

On Page 3, Item (56), line 11, under "Other Publications," please change "appolication" to --application--.

On Page 3, Item (56), line 27, under "Other Publications," please change "USLI" to --ULSI--.

On Page 3, Item (56), line 38, under "Other Publications," please change "iIDEM" to --ilDEM--.

In Col. 1, line 24, please change "al" to --al.--.

In Col. 3, line 65, please change "examply" to --example--.

In Col. 4, line 64, please change "$WF_6AlCl_3$" to --$WF_6$, $AlCl_3$--.

In Col. 4, line 65, after "TaSiN" please insert --,--.

In Col. 5, line 13, please change "mm." to --nm.--.

In Col. 6, line 5, please change "buthyne" to --butyne--.

In Col. 6, line 6, please change "cyclohepthene," to --cycloheptene,--.

In Col. 6, line 51, Claim 6, after "Hf" please insert --,--.

In Col. 8, line 1, Claim 14, please change "TiAIN," to --TiAlN--.

Signed and Sealed this

Twenty-eighth Day of September, 2010

David J. Kappos
*Director of the United States Patent and Trademark Office*